US 6,539,048 B2

(12) United States Patent
Hakala (10) Patent No.: US 6,539,048 B2
(45) Date of Patent: *Mar. 25, 2003

(54) RING MATCHED FILTER FOR SYNCHRONIZING TO A SPREADING CODE

(75) Inventor: Mika Hakala, Oulu (FI)

(73) Assignee: Nokia Mobile Phones Ltd., Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 7 days.

(21) Appl. No.: 09/418,085

(22) Filed: Oct. 14, 1999

(65) Prior Publication Data

US 2002/0118731 A1 Aug. 29, 2002

(51) Int. Cl.[7] .............................................. H04L 27/30
(52) U.S. Cl. .................... 375/143; 375/152; 375/343
(58) Field of Search ................................ 375/141, 142, 375/143, 150, 152, 343; 370/320, 335, 342, 441

(56) References Cited

U.S. PATENT DOCUMENTS

| 4,707,839 | A | * | 11/1987 | Andren et al. ............... 375/150 |
| 5,737,368 | A | * | 4/1998 | Shou et al. ................... 375/343 |
| 5,781,584 | A | * | 7/1998 | Zhou et al. ................... 375/207 |
| 5,844,937 | A | * | 12/1998 | Zhou et al. ................... 375/207 |
| 5,960,033 | A | * | 9/1999 | Shibano et al. .............. 375/207 |
| 6,035,320 | A | * | 3/2000 | Kiriaki et al. ............... 708/819 |
| 6,088,382 | A | * | 7/2000 | Maru .......................... 375/142 |
| 6,163,563 | A | * | 12/2000 | Baker et al. ................. 375/130 |
| 6,169,771 | B1 | * | 1/2001 | Shou et al. .................. 375/343 |
| 6,181,733 | B1 | * | 1/2001 | Shinde ........................ 375/152 |

FOREIGN PATENT DOCUMENTS

| DE | 3735374 | 10/1987 | ......... G06F/15/336 |
| DE | 3735374 A | 5/1989 | |
| EP | 0855796 | 7/1998 | .......... H03H/17/02 |
| EP | 0886386 | 12/1998 | ........... H04B/1/707 |

* cited by examiner

Primary Examiner—Stephen Chin
Assistant Examiner—Dac V. Ha
(74) Attorney, Agent, or Firm—Harrington & Smith, LLP (57) ABSTRACT

A mobile station is provided for receiving a spread spectrum, code division transmission from at least one transmitter, such as a base station. The mobile station contains a receiver for outputting data samples, and further contains a multi-tap ring matched filter. The ring matched filter is constructed to have first circuitry for storing an individual one of a received data sample into an individual one of a plurality storage registers such that a active data sample that has been stored for the longest period of time is overwritten with a most recently received data sample. The ring matched filter is further constructed to have second circuitry for serially shifting coefficient bits of at least one multi-bit spreading code relative to the storage registers for sequentially and simultaneously correlating the at least one multi-bit spreading code with a plurality of corresponding stored data samples, while significantly reducing power consumption by limiting state changes of flip-flops.

31 Claims, 6 Drawing Sheets

RING MATCHED FILTER FOR SYNCHRONIZING TO A SPREADING CODE

FIELD OF THE INVENTION

This invention relates generally to matched filters, as well as to spread spectrum, code division, multiple access (CDMA) receivers and, more particularly, to matched filters for correlating a spreading code, such as a pseudonoise (PN) spreading code, with sampled received data.

BACKGROUND OF THE INVENTION

The matched filter is known to be a relatively simple yet powerful and versatile device. For these reasons it has been utilized for impulse response measurements and for making an initial synchronization to a received data stream. One specific application includes CDMA receivers. Other potential applications include newer, so-called third generation (3G), wide-band CDMA receivers. The hardware implementations of such matched filters typically employ a number of gates that are interconnected into flip-flops (FFs), and which are located within an Application Specific Integrated Circuit (ASIC).

For advanced applications, such as the 3G CDMA application, the complexity of the matched filter is increased, as is the filter length (e.g., 128 or 256 taps with an oversampling ratio of up to four.) This increase in complexity requires a large number of gates. One result of the large number of required gates, combined with the typically high clocking frequency (e.g., 16 MHz or 20 MHz), is an increase in ASIC power consumption. This is due to the large number of gate state changes that can occur on each clock transition. As is well known, the most power is consumed when gates change state or switch from one state to another (high to low or low to high). As such, the more gates that change state per unit time, the greater is the power consumption. For portable and battery powered devices, such as radiotelephones and personal communicators, the increased power consumption has a direct impact on 'talk time' and 'standby time', i.e., the time available for communications before the battery needs to be recharged. The increased power consumption can also have ramifications in the overall design and layout of the circuitry.

A conventional matched filter may be considered to have a basically linear (logically) architecture. In the conventional matched filter a reference code (one bit wide) is held in one location and the incoming data, which is typically more than one bit wide, is moved through (down) the filter, filter stage by filter stage. This results in numerous logic state changes in the ASIC gates. By example, in a CDMA code acquisition application the reference code will typically be one bit wide, but have a length of, for example, 128 bits or 256 bits.

Figure 1:
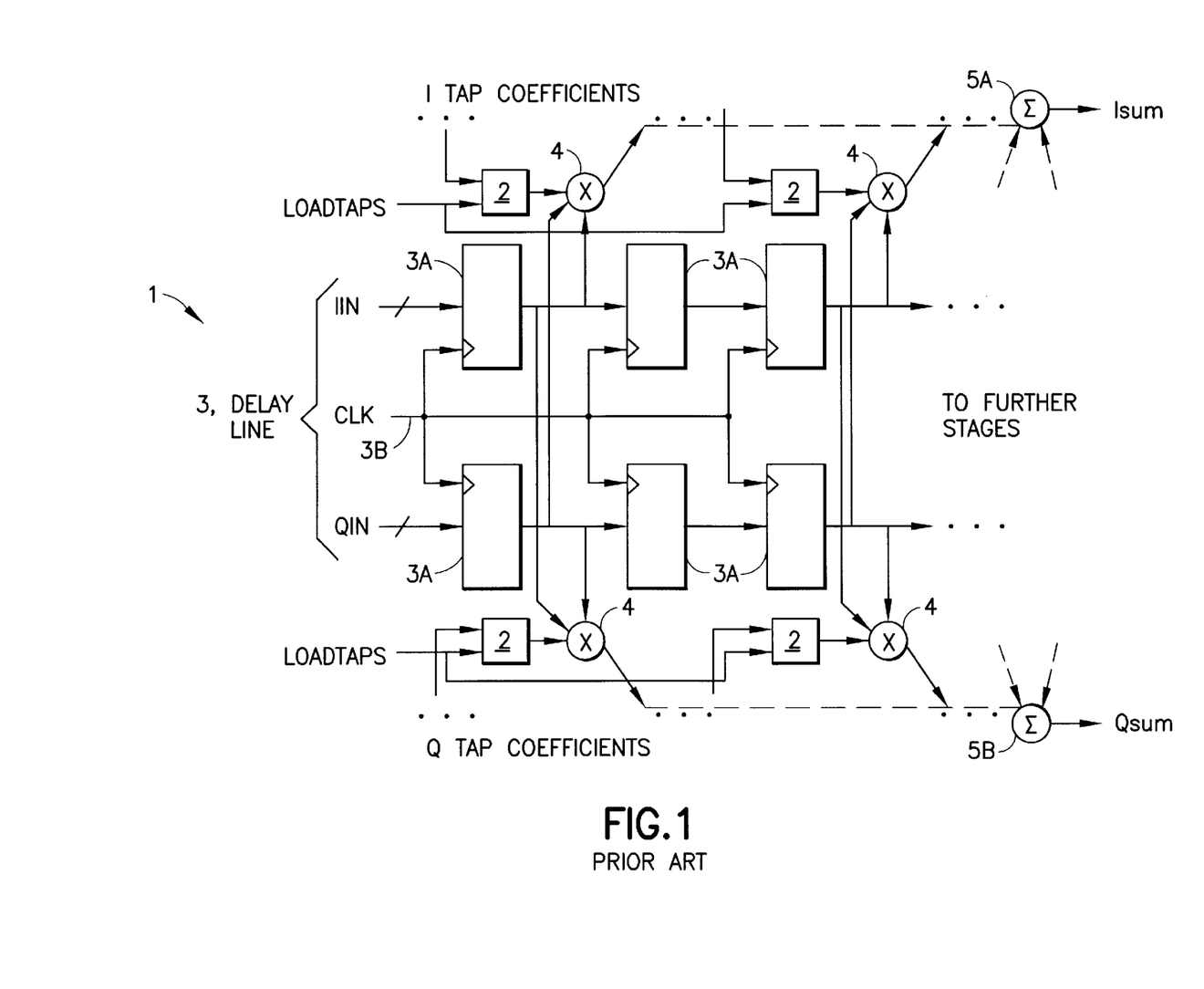
FIG. 1 depicts a small portion of a conventional matched filter, specifically a conventional dual delay line type intended for despreading a complex-spread data stream.

Referring to FIG. 1, in the conventional matched filter 1 the tap coefficients are loaded into tap registers 2, and are remain fixed in position as data passes through a multi-stage delay line 3. In this example the data words are input Inphase (IIN) and Quadrature (QIN) words, and are typically comprised of a plurality of bits. The outputs of the flip-flop (FF) registers 3A (each typically several bits wide) of the delay line 3, as well as the outputs of the tap coefficient registers 2, are input to multipliers 4. When complex spreading is used, the effect is to multiply IIN by both the I and Q tap coefficients, and to multiply QIN by both the I and Q tap coefficients. As pairs of IIN and QIN values propagate down the delay line 3 under the control of a clock (CLK) signal 3B, new IIN and QIN values are loaded into the input stage. Assuming that the input data stream matches (is correlated with) the I and Q coefficients held in the registers 2, e.g., I and Q coefficients that represent a PN (de)spreading code, at some point a maximum output (correlation peak) will be observed from the outputs Isum and Qsum of an adder tree structure (shown generally as summation nodes Isum 5A and Qsum 5B.)

In other embodiments, such as one using real code spreading (as opposed to complex code spreading), differences exist in the multiplier/adder tree structure. However, the basic delay line structure remains the same as the complex code spreading embodiment.

While being relatively straightforward to implement, the conventional matched filter 1 exhibits many state changes in the outputs of the delay line flip-flops (FF). If one assumes that the I and Q delay lines 3A and 3B are both three bits wide, and up to 1024 FFs long (256 taps*4 times oversampling), then (3*1024*2=6,144) FFs are loaded on each clock cycle. If the probability that a FF changes state when loaded is P(Ffchange)=0.5, then on average 3,072 state changes occur on every clock cycle. Each state change causes the ASIC containing the matched filter delay line 3 to consume power.

According to reasonable estimates, the matched filter for a 3G CDMA embodiment (assuming four times oversampling and 256 taps) would be the greatest single power consumer in the digital ASIC. It is thus desirable to reduce the power consumption of the matched filter(s) in the 3G CDMA application, as well as in other applications where matched filters may be employed.

OBJECTS AND ADVANTAGES OF THE INVENTION

It is a first object and advantage of this invention to provide an improved matched filter that exhibits a reduced power consumption.

It is a further object and advantage of this invention to provide an improved matched filter having a ring buffer architecture, wherein the received data samples are stored in registers and are not shifted through a delay line, and wherein the coefficient data is shifted relative to the fixed data samples thereby significantly reducing the number of gate logic state changes per clock cycle.

It is another object and advantage of this invention to provide a mobile station that is constructed to include the improved matched filter having the ring buffer architecture that exhibits reduced power consumption.

SUMMARY OF THE INVENTION

The foregoing and other problems are overcome and the objects are realized by methods and apparatus in accordance with embodiments of this invention.

A matched filter is disclosed for synchronizing a spreading code with a sampled received data stream in a receiver, such as a mobile station receiver in a spread spectrum, code division wireless communications system. The matched filter is constructed to include a ring buffer architecture wherein received data samples are loaded one sample at a time, such that the oldest (active) sample is replaced by the newest sample, and a spreading code is shifted within the matched filter to a predetermined position in relation to the ring buffer. As such, the matched filter of this invention may be termed a "ring matched filter" to distinguish it from the conventional linear matched filters, such as the one described above with respect to FIG. 1.

Reference to the oldest (active) sample is made to highlight an embodiment wherein, by example, a 256 tap filter is operated in a 128 tap mode or a 64 tap mode by "halving" or "quartering" the ring buffer through the use of multiplexers. In this case, the "oldest" sample in the ring buffer may not be overwritten, but, for example, the 128th or 64th sample will be. Thus, and while there may be stored samples in the ring buffer that may have been stored longer than the sample being overwritten, the sample being overwritten is considered herein to be in the "active" portion of the ring buffer, while the older samples are considered herein to be in an "inactive" portion of the ring buffer (e.g., in stages between 129–256 for the 128 tap mode case.)

One significant advantage of the ring matched filter according to the invention is that it consumes less power than the conventional (linear) matched filter discussed above, wherein the reference code (typically one bit) is held still and the incoming multi-bit data is shifted through the filter's delay line. This conventional approach results in more ASIC logic state changes as compared to the ring matched filter of this invention, wherein the incoming data samples are held still and only the one bit spreading code is moved.

Also disclosed is a mobile station for receiving a spread spectrum, code division transmission from at least one transmitter such as, but not limited to, a base station. The mobile station contains a receiver for outputting data samples, and further contains a multi-tap ring matched filter. The ring matched filter is constructed to have first circuitry for storing an individual one of a received data sample into an individual one of a plurality storage registers such that an active data sample that has been stored for the longest period of time is overwritten with a most recently received data sample. The ring matched filter is further constructed to have second circuitry for serially shifting coefficient bits of at least one multi-bit spreading code relative to the storage registers for sequentially and simultaneously correlating the at least one multi-bit spreading code with all of the stored data samples, for a case with no oversampling, while significantly reducing power consumption by limiting state changes of flip-flops. For a case with higher oversampling, for example two times oversampling, one set of corresponding data samples (e.g. odd samples) are correlated at one instant (clock cycle), while at another clock cycle another set of corresponding data samples (e.g. even samples) are correlated.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

In that most of the power consumption of the matched filter results from gates changing state, the inventor has realized that the number of gate state changes should be reduced or minimized, and has also provided a ring matched filter architecture that realizes a reduction in both gate state changes and overall power consumption.

It is first noted that a result that propagates through the adder tree of a matched filter is always the same, no matter how the result is calculated (assuming that the result is calculated correctly.) This being true, there is little that can be done to optimize the arithmetic parts of the matched filter. However, the manner in which the matched filter stores and shifts data internally can be altered.

The following analysis is based on several assumptions. A first assumption in that the matched filter performs the tasks of two complex (as opposed to real) matched filters. By so combining the two matched filters, a single delay line can be shared by both, resulting in a reduction in gate number and power consumption. It should be realized that a single matched filter could be used as well, for those applications wherein only one filter is desirable. A second assumption is that the input Inphase and Quadrature (I,Q) words are three bits wide. However, four or more bits may be preferred in some applications since as the number of bits increases, so does the degree of resolution of the input data signal. A third assumption is that the matched filters have 128 taps or 256 taps, although more or less taps could be employed. A fourth assumption is that the matched filters operate with two times oversampling or with four times oversampling, although other oversampling ratios could be used as well. Finally, a fifth (non-limiting) assumption is that all tap coefficients are one bit wide and have shadow tap registers that can be used to serially shift data in, and then load the data to coefficient registers in just one clock cycle.

Figure 2:
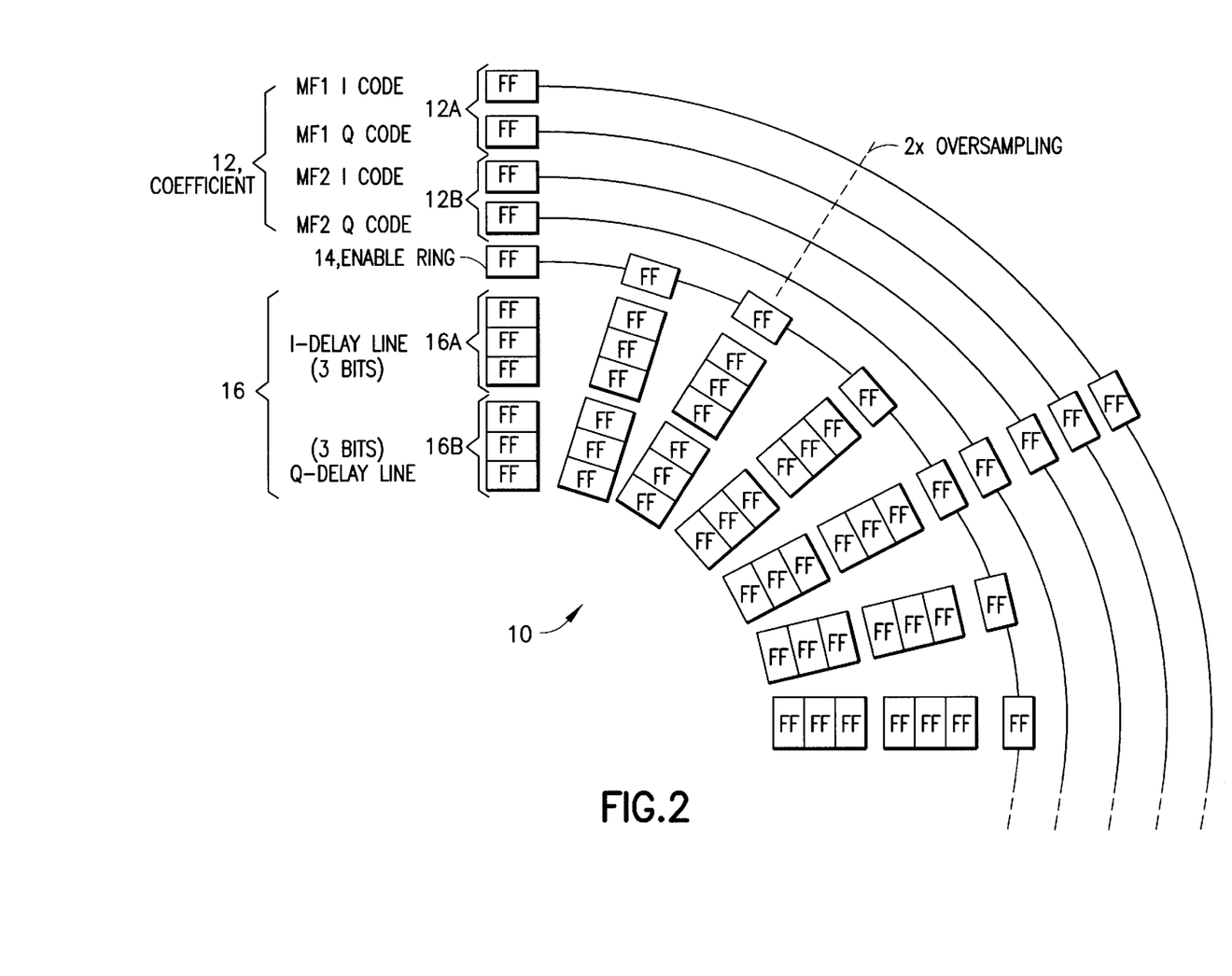
FIG. 2 a block diagram that illustrates a portion of a ring matched filter in accordance with the teachings of this invention.

Referring now to FIG. 2, a ring matched filter 10 in accordance with this invention includes an outer coefficient ring 12 that contains, in the presently preferred two filter embodiment, a first matched filter I and Q coefficient code ring 12A and a second matched filter I and Q coefficient code ring 12B. In a single filter embodiment the first matched filter I and Q coefficient code ring 12A could simply be deleted, leaving only the second matched filter I and Q coefficient code ring 12B. In this case the embodiment becomes analogous with the embodiment shown in FIG. 4.

The architecture depicted in FIG. 2 beneficially enables two different spreading codes to be correlated against the same input data stream. One of the spreading codes could be received from a first transmitter, and the other received from a second transmitter, or both spreading codes may be received (on different channels) from the same transmitter.

The ring matched filter 10 further in accordance with this invention includes an enable ring 14. The enable ring 14 may be considered as a circular shift register that shifts a token (e.g., a logic one) around the ring. The location of the token indicates into which stage of the I,Q delay line 16 the next data sample is to be loaded. The I,Q delay line 16 is comprised of a multi-bit (e.g., 3-bit) I delay line 16A and a multi-bit (e.g., 3-bit) Q delay line 16B.

In operation the I,Q delay line 16 is loaded at the sample rate, while the outer coefficient ring 12 rotates at the chip rate. If one times oversampling is in use, then the chip rate is equal to the sample rate, while if two times oversampling is in use then the sample rate is two times the chip rate, etc.

An important aspect of the ring architecture shown in FIG. 2 is that the sampled data in the delay line 16 is held still while the code, found in the coefficient ring(s) 12, moves with respect to the delay line. Since the code is but one bit wide, a very significant reduction in gate state changes results, as compared to the prior art linear matched filter 1 discussed above.

The new input data is loaded into the ring matched filter 10 sample by sample under control of the circulating token in the enable ring 14, with the oldest (active) sample in the circular delay line 16 being replaced with the newest sample. In this manner only the outputs of the I,Q delay stage 3A, 3B currently being loaded have the potential to change state (e.g., 6-bits in this example), with all of the delay line stages remaining constant. Furthermore, assuming P(Ffchange)= 0.5, on average only three FFs will change state in the delay line 16, as compared to the average of 3072 FFs changing state per clock cycle in the prior art matched filter 1.

In the four times oversampling case, four codes (MF1 I,Q and MF2 I,Q) are fed in serially instead of in parallel. This does not present a problem, however, as the ring matched filter 10 operates in a pipelined fashion so that results are available after a 1, 2, 3 or 4 clock cycle latency. A simple delay equalizer unit (not illustrated) can be employed to accommodate the clock cycle latency.

Further with regard to four times oversampling, it is noted that the selected oversampling ratio affects only the manner in which the coefficients are ordered in the coefficient ring 12. Whatever the oversampling ratio that is selected, all samples must be multiplied with every code bit at some point in the processing. The main issue relates to the construction of the multiplier/adder tree structure. While two times oversampling is a relatively simple case, if four times oversampling is used then the additional components, such as multipliers, may be reused to provide other functionality (e.g., the second coefficient ring 12 B.)

The ring buffer enabling logic 14 employs, for example, additional logic, such as 1024 FFs and 1024 MUXes, if the enabling is performed using the one additional flip-flop ring 14 that circulates one logic one bit and 1023 zero bits. In other embodiments, and referring to FIG. 5, the delay line 16 load enable function can be implemented instead by using a 1024 state free-running counter 18 and a decoder 20 that decodes the counter output to enable one delay line storage register at a time.

Figure 5:
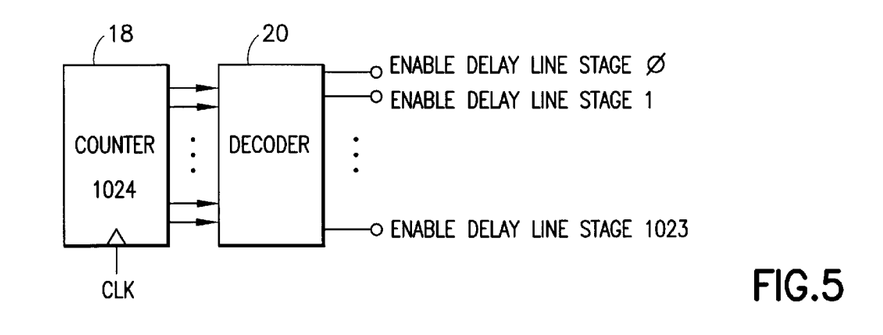
FIG. 5 illustrates an embodiment of a delay line load enable function implemented with a free-running counter and a decoder, which can be used to replace the enable ring of FIGS. 2, 3 and 4.

In either of these embodiments of the enable ring 14 the sampled data is not shifted through the stages of the delay line 16, thereby minimizing the number of logic transitions and reducing power consumption.

Figure 4:
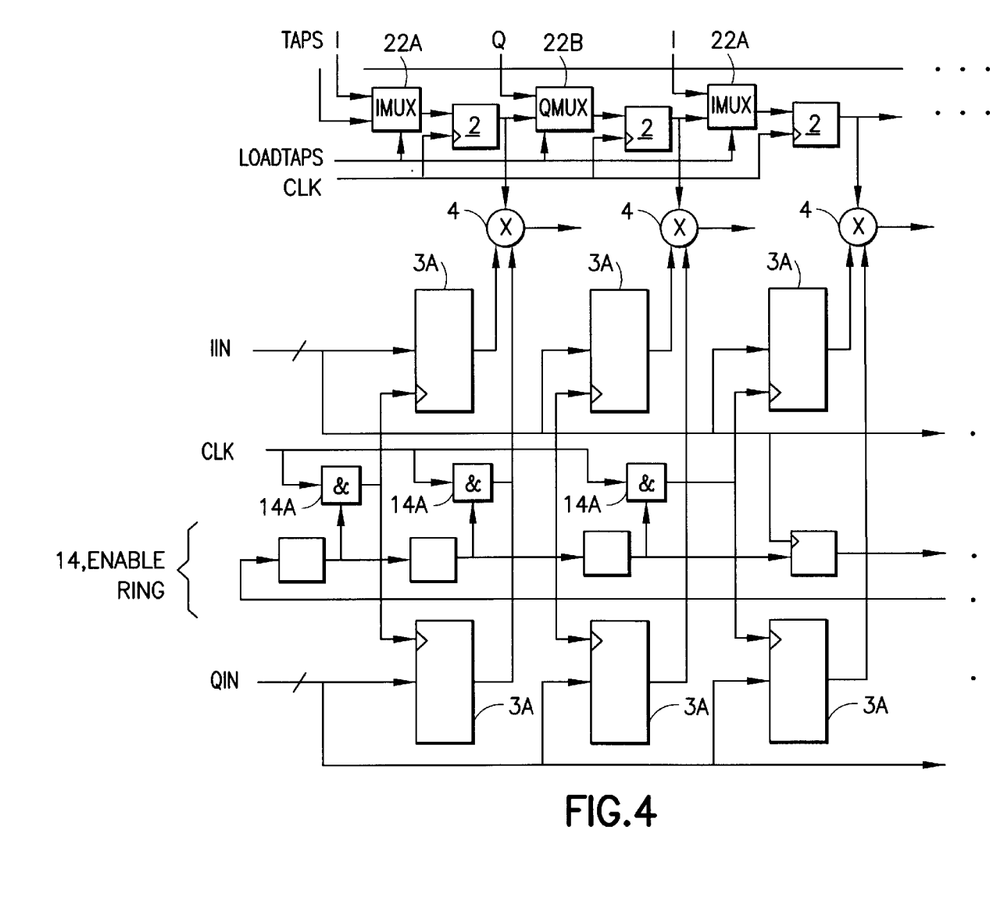
FIG. 4 is a circuit diagram illustrating a second embodiment of the ring matched filter of FIG. 2.

A further embodiment uses the load enable signal to also enable clocking to only the particular delay line 16 stage that is enabled (see FIG. 4). This results in further power conservation by selectively inhibiting the clock (e.g., 8/16 MHz clock) from being applied to all of the 6144 FFs of the delay line 16. Instead, the clock is applied to only the six FFs 3A that are currently being loaded with the latest sampled data. only one additional AND gate 14A is required per delay line stage to implement this clock gating feature.

If a real spreading code, as opposed to a complex spreading code, is employed in the downlink (transmitter to mobile station), the ring matched filter is otherwise similar to the complex ring matched filter 10 described thus far, except that both the I and Q branches are spread with only a single code. A result is that the amount of delay line 16 logic remains the same, but the arithmetic portion of the ring matched filter is reduced by one half.

Figure 3:
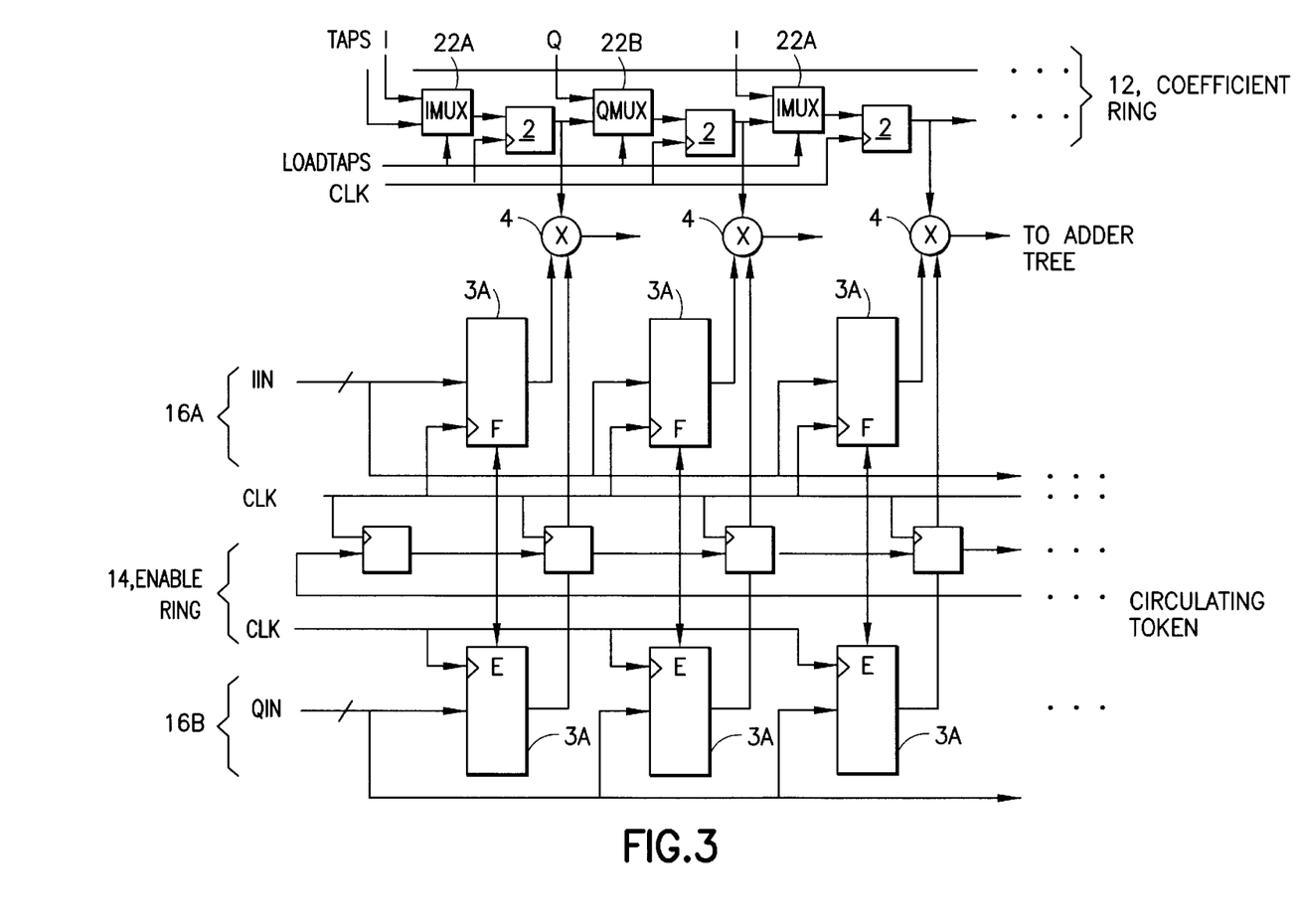
FIG. 3 is a circuit diagram illustrating a first embodiment of the ring matched filter of FIG. 2.

Reference is now made to FIGS. 3 and 4 for illustrating in further detail two embodiments of the ring matched filter 10 of FIG. 2. The first ring matched filter embodiment of FIG. 3 uses the clock and enable signals in a normal fashion in the ring registers, while in the second embodiment the clock signal is gated by the enable signal, as discussed above, to reduce the number of clocked FFs per clock cycle from some thousands to but six (assuming three bit I and Q values) or eight (assuming four bit I and Q values). The system clock (CLK) signal is used for both the code (coefficient) ring 12 and the enable ring 14.

Note should be made that in FIG. 3 the circulating enable token is applied, at any given time, to enable (E) inputs of the FFs 3A of only one stage of the delay line 16. As such, only these FFs respond to the transition of CLK edge, and thus only these FFs store the sampled data appearing at their data inputs. The other FFs 3A (i.e., those that do not have the enabling token input at that time) do not respond to the CLK transition, and thus their outputs do not change state.

The ring matched filter 10 embodiment depicted in FIG. 3 shows the two times oversampling case, and the I and Q delay lines are placed on the same ring. For the four times oversampling case one may double the amount of FFs in the coefficient ring 12, or use the illustrated two times oversampling embodiment and interpolate between samples.

It should be noted as well that the coefficient ring 12 includes I and Q coefficient multiplexers (IMUX 22A and QMUX 22B) that enable multiplexing the current code (from the adjacent ring coefficient stage) or a new code into the coefficient registers 2. The use of the IMUX 22A and QMUX 22B enables the coefficients (representing a spreading code) to be circulated around the ring matched filter 10, from coefficient stage to coefficient stage, while the incoming data samples are stored one by one into the delay line FFs 3A under the control of the circulating token in the enable ring 14. When a new spreading code is to be loaded, the multiplexers 22A ann 22B are instead controlled to route the values appearing at the input I and Q taps to the inputs of the coefficient ring FFs 2, as opposed to the outputs of the adjacent coefficient ring FFs. Note that in this embodiment every transition of the CLK signal is applied to the inputs of each of the logic elements, including all of the delay line FFs 3A.

FIG. 4 illustrates a presently preferred embodiment of the ring matched filter 10. This embodiment is similar to the embodiment of FIG. 3, and further includes the above-mentioned gating logic (AND gates 14A) in the enable ring 14. Note that as the circulating token passes from stage to stage the output of the associated enable ring 14 FF also provides a qualifying input to the associated AND gate 14A. This qualifying input enables the CLK input to be gated through the AND gate 14A to the clock inputs of the associated delay line FFs 3A, while all other delay line FFs remain unclocked. As such, even further power savings are realized.

Although the embodiment of FIG. 4 has been described in the context of the use of AND gates 14A, in other embodiments other types of gating logic could be used. For example, an invertor could be used at the output of the enable ring 14 FFs to invert the token, and an OR gate could then be used to gate the clock transition through to the associated delay line FFs 3A.

It is noted that while one could simply employ the edge of the token as a clocking signal, it is preferred to use one common clock throughout the circuit to provide better control over time-critical aspects of the circuit design and layout.

Figure 6:
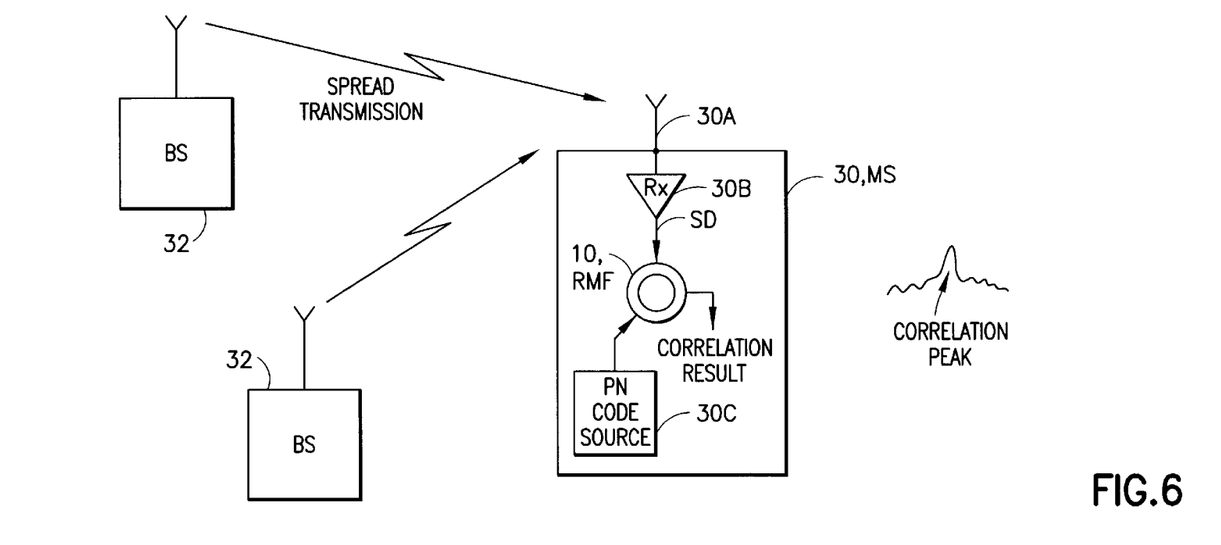
FIG. 6 is a simplified block diagram of an exemplary wireless communications system having a mobile station and a plurality of transmitters, wherein the mobile station contains the ring matched filter shown in one of the embodiments of FIGS. 3 and 4.

FIG. 6 shows an exemplary wireless communications system employing a mobile station (MS) 30 and a plurality of transmitters, which may be embodied within base stations (BS) 32. The spread spectrum, code division downlink transmissions from the base stations 32 are spread using respective spreading codes, for example Walsh-Hadamard pseudonoise (PN) spreading codes. The mobile station 30 includes an antenna 30A and a receive block containing amplifiers, down converter(s), and demodulators, generally shown as a receiver (RX) 30B. The output of the receiver 30B comprises the sampled data (SD) that is input, sample by sample, into the delay line stage 16 of the ring matched filter (RMF) 10 of this invention. The mobile station 30 also includes a PN code source 30C having an output that is loaded into the coefficient ring 12 of the ring matched filter 10. After being loaded, the PN code coefficients are circulated around the coefficient ring 12, as described above, and at each stage the arithmetic unit, such as the adder trees 5A and 5B, develop a correlation result. At a time when the coefficient ring 12 is chip aligned with the received sampled data in the delay line 16 a correlation peak will be observed. For the case where it is desired to simultaneously lock-on to or otherwise synchronize to or receive a spread transmission from another base station 32 (or a second transmission from the same base station), coefficients representing two PN codes are loaded into the coefficient rings 12A and 12B, and both PN codes are applied against the received sampled data, thereby enabling the mobile station 30 to synchronize to or receive both spread transmissions.

Figure 7:
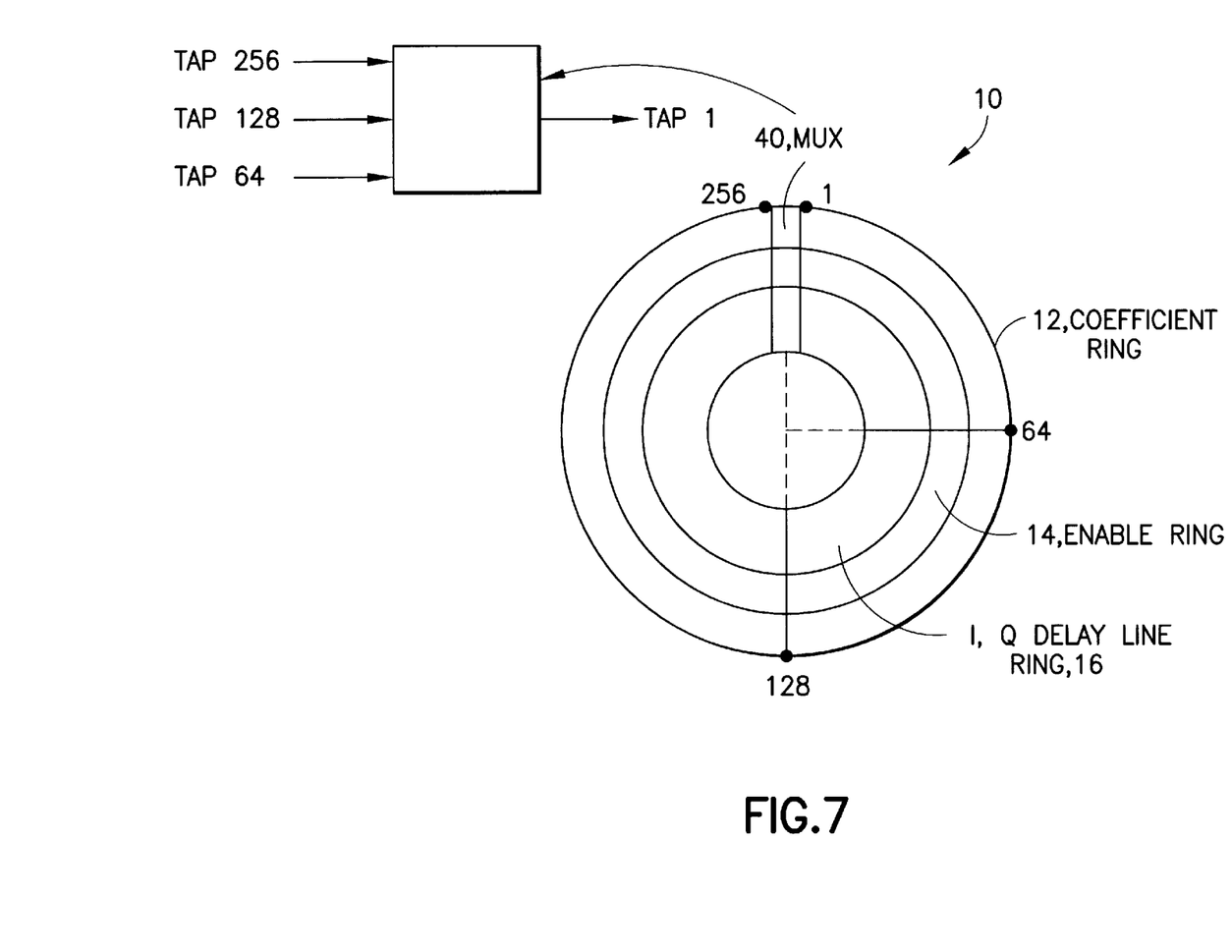
FIG. 7 depicts an embodiment of the invention wherein the ring matched filter is configurable to have a number of different tap lengths.

FIG. 7 depicts an embodiment of this invention wherein the ring matched filter 10 is configurable to have a number of different tap lengths, and thus a different number of active samples. Assuming as an example a 256 tap ring matched filter 10, then switching circuitry, such as a multiplexer 40, is controlled by at least one externally applied control signal to connect the output of tap 256 to the input of tap 1, or the output of tap 128 to the input of tap 1, or the output of tap 64 to the input of tap 1, etc. The enable ring 14 and delay line rings 16 are shortened correspondingly. When switching off one half of the ring (i.e., taps 129–256) the coding gain is reduced by 3 dB. However, and assuming that the channel quality is good, this reduction in coding gain may not be detrimental, and a significant power savings can be achieved by shutting down the unused circuitry of the ring matched filter 10. If the channel quality degrades, then the multiplexer 40 can be controlled so as to enlarge the ring matched filter 10, thereby increasing the coding gain.

It is noted that the ring matched filter 10 may be shortened as well when receiving or synchronizing to shorter code sequences that 256 chips. In this case the coding gain is not reduced, and all energy that can be received is utilized.

It should be appreciated that the teachings of this invention are not intended to be limited to any specifically disclosed numbers of bits, or delay line stages, or clock frequencies, etc. It is also not a requirement that the ring matched filter 10 be constructed within an ASIC, as discrete components could be used as well. Also, the disclosed embodiment within the mobile station 30, while being presently preferred, is not a limitation upon the practice of this invention. In general, the ring matched filter 10 can be employed in any application wherein matched filters or correlators are currently used, or may be used.

Thus, while the invention has been particularly shown and described with respect to preferred embodiments thereof, it will be understood by those skilled in the art that changes in form and details may be made therein without departing from the scope and spirit of the invention.

What is claimed is:

1. A matched filter, comprising:

an n-stage delay line for storing data samples;

an enable circuit having outputs for enabling the storage, in a sequential manner, of individual ones of said data samples into individual stages of said n-stage delay line;

an m-stage coefficient register for storing coefficient data, wherein adjacent stages of said coefficient register are serially coupled together for shifting coefficient data from stage to stage;

a plurality of combining circuits individual ones of which have inputs coupled to outputs of one of said delay stages and one of said coefficient register stages for combining said outputs together, and circuitry, responsive to a control signal, for changing said n-stage delay line to a p-stage delay line and for changing said m-stage coefficient register to a q-stage coefficient register, where p<n and q<mZ, where n, m, p, q and Z are each an integer, and where said delay line is coupled together in a ring configuration, and where said circuitry is operable to both increase and decrease the size of the ring in response to said control signal.

2. A matched filter as in claim 1, wherein n is equal to m for a one times oversampling case.

3. A matched filter as in claim 1, wherein said enable circuit is comprised of an n-stage shift register for circulating an enable token for enabling, in turn, individual stages of said n-stage delay line to store a most recently received data sample.

4. A matched filter as in claim 3, wherein said n-stage shift register is driven by a clock, and wherein said clock also drives said m-stage coefficient register for shifting said coefficient data from stage to stage.

5. A matched filter as in claim 1, wherein said enable circuit is comprised of a counter having outputs coupled to a decoder for generating signals for enabling, in turn, individual stages of said n-stage delay line to store a most recently received data sample.

6. A matched filter as in claim 5, wherein said counter is an n-state counter that is driven by a clock, and wherein said clock also drives said m-stage coefficient register for shifting said coefficient data from stage to stage.

7. A matched filter as in claim 1, wherein said n-stage delay line stores data samples in response to a transition of a clock signal, and further comprising clock gating circuitry for applying said clock signal transition, at any given time, to only one stage of said n-stage delay line, the one stage being specified by said outputs of said enable circuit.

8. A matched filter as in claim 1, wherein individual stages of said n-stage delay line each store a plurality of bits, and wherein individual stages of said m-stage coefficient register each store one bit.

9. A matched filter as in claim 1, wherein individual stages of said n-stage delay line each store a first plurality of bits representing an Inphase data sample component and a second plurality of bits representing a Quadrature data sample component.

10. A matched filter as in claim 1, wherein said adjacent stages of said coefficient register are serially coupled together through a multiplexer circuit having a first state, and wherein in a second state of said multiplexer circuit said adjacent stages of said coefficient register are decoupled from one another and are coupled instead to externally applied coefficient values.

11. A ring matched filter, comprising:
   an n-stage delay line for storing multi-bit input words representing received data samples;
   an enable circuit having outputs for enabling the storage, in a sequential manner, of individual ones of said data samples into individual ones of the stages of said n-stage delay line such that an active data sample that has been stored for the longest period of time is overwritten with a most recently received data sample;
   an m-stage coefficient register for storing spreading code coefficient data, wherein adjacent stages of said coefficient register are serially coupled together for shifting the spreading code coefficient data from stage to stage, where m is equal to or less than n;
   a plurality of combining circuits individual ones of which have inputs coupled to outputs of one of said delay stages and one of said coefficient register stages for combining said outputs together for producing an indication of a degree of correlation between said spreading code coefficient data and said data samples; and
   switching circuitry operating in response to an externally applied control signal for converting said n-stage delay line to an p-stage delay line, where p is less than m, where n, m and p are each an integer, and where
      said delay line and said coefficient register are coupled together into a ring configuration for implementing said ring matched filter, and where said switching circuitry is operable to both increase and decrease the size of the ring in response to said control signal.

12. A ring matched filter as in claim 11, wherein said enable circuit is comprised of an n-stage shift register for circulating an enable token for enabling, in turn, individual stages of said n-stage delay line to store the most recently received data sample.

13. A ring matched filter as in claim 12, wherein said n-stage shift register is driven by a clock, and wherein said clock also drives said m-stage coefficient register for shifting said spreading code coefficient data from stage to stage.

14. A ring matched filter as in claim 11, wherein said enable circuit is comprised of a counter having outputs coupled to a decoder for generating signals for enabling, in turn, individual stages of said n-stage delay line to store the most recently received data sample.

15. A ring matched filter as in claim 14, wherein said counter is an n-state counter that is driven by a clock, and wherein said clock also drives said m-stage coefficient register for shifting said spreading code coefficient data from stage to stage.

16. A ring matched filter as in claim 11, wherein said n-stage delay line stores data samples in response to a transition of a clock signal, and further comprising clock gating circuitry for applying said clock signal transition, at any given time, to only one stage of said n-stage delay line, the one stage being specified by said outputs of said enable circuit.

17. A ring matched filter as in claim 11, wherein adjacent stages of said spreading code coefficient register are serially coupled together through a multiplexer circuit having a first state, and wherein in a second state of said multiplexer circuit said adjacent stages of said spreading code coefficient register are decoupled from one another and are coupled instead to externally applied spreading code coefficient values.

18. A method of performing a correlation between a predetermined multi-bit spreading code and received data samples, comprising steps of:
   storing an individual one of a received data sample into an individual one of a plurality storage registers such that an active data sample that has been stored for the longest period of time is overwritten with a most recently received data sample;
   serially shifting the bits of the spreading code relative to the storage registers for sequentially and simultaneously correlating the multi-bit spreading code with a plurality of stored data samples; and
   programmably shortening, as a function of at least one criterion, a length of a first shift register that is comprised of said storage registers and a length of a second shift register through which the bits of the spreading code are shifted, where
      said first and second shift registers are each coupled together in a ring configuration, and where said step of programmably shortening operates to decrease a size of the ring, and further comprising a step of programmably increasing, as a function of at least one criterion, a length of said first shift register and a length of said second shift register such that said step of programmably increasing operates to increase the size of the ring.

19. A method as in claim 18, wherein said at least one criterion is comprised of a quality of a channel through which data is received.

20. A method as in claim 18, wherein said at least one criterion is comprised of a length of the spreading code.

21. A method as in claim 18, and further comprising reducing power consumption by powering down at least an unused portion of at least one of said first and second shift registers.

22. A mobile station for receiving a spread spectrum, code division transmission from at least one transmitter, said mobile station comprising a receiver for outputting data samples; first circuitry for storing an individual one of a received data sample into an individual one of a plurality storage registers such that an active data sample that has been stored for the longest period of time is overwritten with a most recently received data sample; and second circuitry for serially shifting bits of at least one multi-bit spreading code relative to the storage registers for sequentially and simultaneously correlating the at least one multi-bit spreading code with a plurality of stored data samples, said mobile station further comprising additional circuitry for programmably shortening, as a function of at least one criterion, a length of a first shift register that is comprised of said storage registers and a length of a second shift register through which the bits of the spreading code are shifted, where said first and second shift registers are each coupled together in a ring configuration, where said additional circuitry operates to decrease a size of the ring, said additional circuitry further programmably increasing, as a function of at least one criterion, a length of said first shift register and a length of said second shift register to increase the size of the ring.

23. A mobile station as in claim 22, wherein said at least one criterion is comprised of a quality of a channel through which data is received.

24. A mobile station as in claim 22, wherein said at least one criterion is comprised of a length of the spreading code.

25. A mobile station as in claim 22, wherein power consumption is reduced by powering down at least an unused portion of at least one of said first and second shift registers.

26. A method of operating a ring matched filter for performing a correlation between at least one predetermined multi-bit spreading code and received data samples, comprising:

sampling data signals received through a communication channel for generating data samples;

storing individual ones of the data samples in a first circular buffer;

serially shifting bits of the at least one multi-bit spreading code through a second circular buffer, relative to the first circular buffer, for sequentially and simultaneously correlating the at least one multi-bit spreading code with a plurality of stored data samples; and programmably changing, as a function of at least one criterion, a length of each of said first and said second circular buffers.

27. A method as in claim 26, wherein said at least one criterion is comprised of a quality of the communication channel.

28. A method as in claim 26, wherein said at least one criterion is comprised of a length of the at least one multi-bit spreading code.

29. A method as in claim 26, and further comprising reducing power consumption by powering down at least an unused portion of at least one of said first and second circular buffers.

30. A method of operating a ring matched filter for performing a correlation between at least one predetermined multi-bit spreading code and received data samples, comprising steps of:

sampling data signals received through a communication channel for generating data samples;

storing individual ones of the data samples in a first circular buffer;

serially shifting bits of the at least one multi-bit spreading code through a second circular buffer, relative to the first circular buffer, for sequentially and simultaneously correlating the at least one multi-bit spreading code with a plurality of stored data samples; and programmably changing the coding gain, in response to a change in the quality of the communication channel, by varying a length of each of said first and said second circular buffers.

31. A method as in claim 30, and further comprising reducing power consumption by powering down at least an unused portion of at least one of said first and second circular buffers.

* * * * *

UNITED STATES PATENT AND TRADEMARK OFFICE
CERTIFICATE OF CORRECTION

PATENT NO. : 6,539,048 B2
DATED : March 25, 2003
INVENTOR(S) : Hakala

It is certified that error appears in the above-identified patent and that said Letters Patent is hereby corrected as shown below:

Column 8,
Line 31, change "$p<n$ and $q<mZ$, where n, m, p, q and Z are each" to -- $p<n$ and $q<m$, where n, m, p, and q are each --

Signed and Sealed this

Twenty-sixth Day of August, 2003

JAMES E. ROGAN
*Director of the United States Patent and Trademark Office*